US012648096B2

(12) United States Patent
Li et al.

(10) Patent No.: US 12,648,096 B2
(45) Date of Patent: Jun. 2, 2026

(54) BRIEFCASE DESIGN SMART SCREEN

(71) Applicant: SHENZHEN ELECTRON TECHNOLOGY CO., LTD, Shenzhen (CN)

(72) Inventors: Yonghong Li, Shenzhen (CN); Wenlong He, Shenzhen (CN); Juntao Liu, Shenzhen (CN)

(73) Assignee: SHENZHEN ELECTRON TECHNOLOGY CO., LTD, Shenzhen (CN)

( * ) Notice: Subject to any disclaimer, the term of this patent is extended or adjusted under 35 U.S.C. 154(b) by 176 days.

(21) Appl. No.: 18/424,260

(22) Filed: Jan. 26, 2024

(65) Prior Publication Data

US 2025/0151215 A1 May 8, 2025

(30) Foreign Application Priority Data

Nov. 2, 2023 (CN) .......................... 202322985280.3

(51) Int. Cl.
H05K 5/02 (2006.01)

(52) U.S. Cl.
CPC ......... H05K 5/0226 (2013.01); H05K 5/0234 (2013.01)

(58) Field of Classification Search
None
See application file for complete search history.

(56) References Cited

U.S. PATENT DOCUMENTS

| | | | | |
|---|---|---|---|---|
| 6,504,706 | B2 * | 1/2003 | Stewart ................. | G06F 1/1679 |
| | | | | 345/169 |
| 6,654,235 | B2 * | 11/2003 | Imsand ................. | G06F 1/1607 |
| | | | | D14/335 |
| 11,507,142 | B1 * | 11/2022 | Davis .................... | G06F 1/1656 |
| D1,033,410 | S * | 7/2024 | Kim .............................. | D14/239 |
| 2007/0200931 | A1 * | 8/2007 | Hwang ................ | F16M 11/105 |
| | | | | 348/184 |
| 2011/0092294 | A1 * | 4/2011 | Mercier .................. | A63F 13/90 |
| | | | | 463/46 |
| 2024/0302686 | A1 * | 9/2024 | Jeon ........................ | H10K 59/87 |

(Continued)

FOREIGN PATENT DOCUMENTS

| | | |
|---|---|---|
| CN | 2502326 U | 7/2002 |
| CN | 207663344 U | 7/2018 |
| CN | 216310654 U | 4/2022 |

*Primary Examiner* — Allen L Parker
*Assistant Examiner* — Christopher L Augustin
(74) *Attorney, Agent, or Firm* — MUNCY, GEISSLER, OLDS & LOWE, P.C.

(57) ABSTRACT

Provided is a briefcase design smart screen including an upper housing and a lower housing, a rear part of the upper housing is hingedly connected to a rear part of the lower housing, a speaker assembly is provided in the upper housing, a control assembly and a display assembly are provided in the lower housing, and the control assembly is electrically connected to the speaker assembly; and the display assembly includes a support frame, a connecting arm, and a display screen, in which one end of the support frame is rotatably arranged in the lower housing, the other end of the support frame is hingedly connected to one end of the connecting arm, the display screen is rotatably disposed at the other end of the connecting arm, and the display screen is electrically connected to the control assembly.

8 Claims, 10 Drawing Sheets

(56) References Cited

U.S. PATENT DOCUMENTS

| 2024/0302858 A1* | 9/2024 | Koong | ................. | G06F 1/1683 |
| 2024/0324117 A1* | 9/2024 | Hyun | ................... | G06F 1/1681 |
| 2025/0081370 A1* | 3/2025 | Ahn | ...................... | G06F 1/1601 |

* cited by examiner

BRIEFCASE DESIGN SMART SCREEN

CROSS-REFERENCE TO RELATED APPLICATIONS

This application claims the priority of Chinese Patent Application No. 202322985280.3, filed on Nov. 2, 2023, the entire contents of which are hereby incorporated by reference.

FIELD OF TECHNOLOGY

The present application relates to the technical field of electronic equipment, in particular to a briefcase design smart screen.

BACKGROUND

Existing multimedia devices are generally large in size and are inconvenient to carry and store. They need to be equipped with additional support structures and storage structures, and are assembled and fixed together for use. However, it requires time-consuming and complex assembly and erection when used. In addition, existing multimedia devices usually include a display screen. Current display screens can only be easily erected when in use, and a angle or height of the display screen cannot be adjusted. Therefore, current multimedia devices have shortcomings such as inconvenience in movement and storage, and the inability to freely adjust the angle or height of the display screen, etc.

SUMMARY

An aspect relates to a briefcase design smart screen as a multimedia device, which is easy to carry, has functions such as loudspeaking, display, etc., and is flexible and convenient in adjusting an angle and height of a display screen.

Another aspect of the present application provides a briefcase design smart screen including an upper housing and a lower housing, in which a rear part of the upper housing is hingedly connected to a rear part of the lower housing, and a front part of the upper housing is locked with a front part of the lower housing; a speaker assembly is provided in the upper housing, a control assembly and a display assembly are provided in the lower housing, and the control assembly is electrically connected to the speaker assembly; and the display assembly includes a support frame, a connecting arm, and a display screen, in which one end of the support frame is rotatably arranged in the lower housing, the other end of the support frame is hingedly connected to one end of the connecting arm, the display screen is rotatably disposed at the other end of the connecting arm, and the display screen is electrically connected to the control assembly.

Compared with traditional technology, the beneficial effects of the briefcase design smart screen described in the present application are: the briefcase design smart screen of the present application is able to be freely carried through the design of the upper housing and the lower housing that are able to be closed together. Furthermore, the speaker assembly is provided in the upper housing, the control assembly and the display assembly are provided in the lower housing, which ensures the briefcase design smart screen of the present application has functions such as loudspeaking function, display function, etc., while it does not occupy too much volume and its layout is compact and reasonable, and the display screen is easy to use and store, and a user is able to freely and flexibly adjust a height or angle of the display screen.

For better understanding and implementation, the present application will be described in detail below with reference to the accompanying drawings.

BRIEF DESCRIPTION

Figure 1:
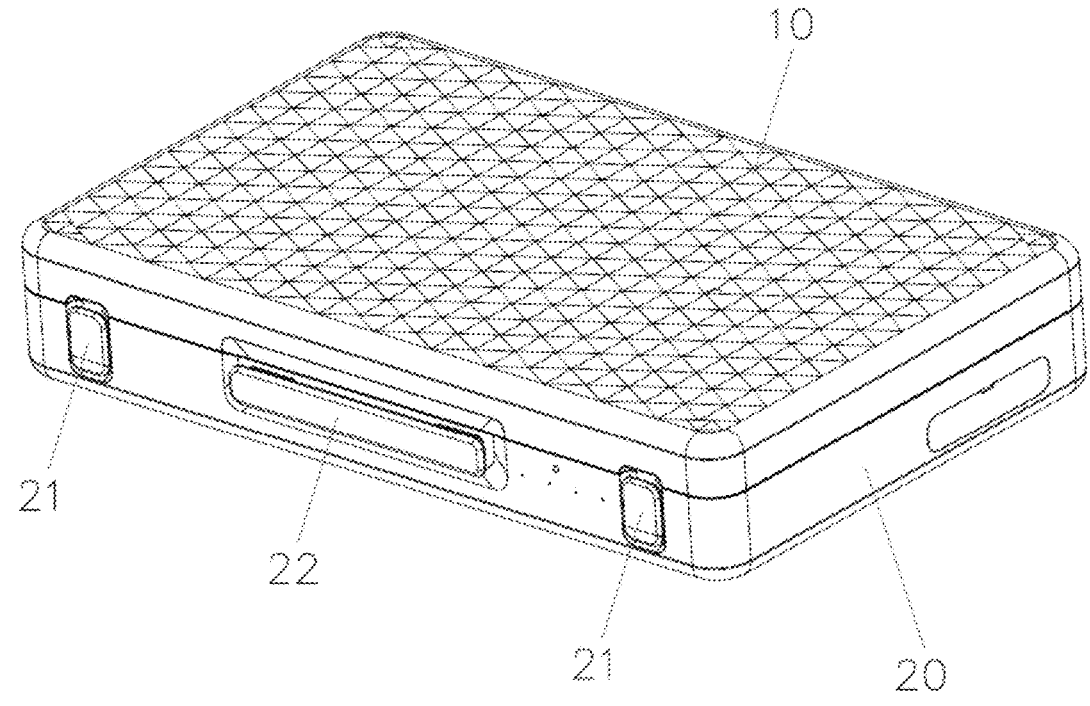
FIG. 1 is a schematic structural view of a briefcase design smart screen of the present application.

EXPLANATION OF REFERENCE SYMBOLS 10. upper housing; 11. hinge member; 12. top box; 121. wire passing holes; 13. top cover; 14. sound transmission opening; 20. lower housing; 21. latch; 22. handle; 23. bottom box; 24. receiving groove; 25. receiving portion; 251. cover plate; 30. speaker assembly; 31. speaker unit; 40. control assembly; 41. control mainboard; 42. power supply; 43. pluggable interface; 431. pluggable interface cover; 44. charging port; 441. charging cover; 45. control switch; 50. display assembly; 51. support frame; 511. first wire passing hole; 512. coaxial rotation shaft hole; 52. connecting arm; 521. second wire passing hole; 53. display screen; 54. support damping rotating shaft; 55. connecting damping rotating shaft; 56. rotating base; 561. rotating pillar; 561A. stopping portion; 562. rotating sleeve; 562A. first rotating sleeve; 562B. second rotating sleeve; 562C. through hole; 562D. plate portion; 562E. flange portion; 563. friction sleeve; 564. rotating front plate; 564A. stopping groove; 57. support base; 571. coaxial support shaft hole; 58. support screw shaft; 59. damping spring; 60. escape groove; 61. display middle frame; 62. display main body; 63. screen adapter board; 631. main body; 632. movable plate; 632A. opening; 65. protective pad.

DETAILED DESCRIPTION

To further explain each embodiment, the present application provides drawings. These drawings are part of the disclosure of the present application, and are mainly used to illustrate the embodiments, and can be used to explain the operating principles of the embodiments in conjunction with the relevant descriptions in the specification. With reference to these contents, those of ordinary skill in the art should be able to understand other possible implementations and the advantages of the present application.

In the description of the present application, it should be understood that the terms that indicate orientation or positional relationship "center", "longitudinal", "transverse", "length", "width", "thickness", "upper", "lower", "left", "right", "top", "bottom", "inner", "outer", "axial", "radial", "circumferential", etc. are based on the orientation or position shown in the drawings, which is only for the convenience of describing the present application and simplifying the description, but does not indicate or imply that the device or element referred to must have a specific orientation, be constructed and operated in a specific orientation, and therefore cannot be construed as a limitation of the present application.

Figure 2:
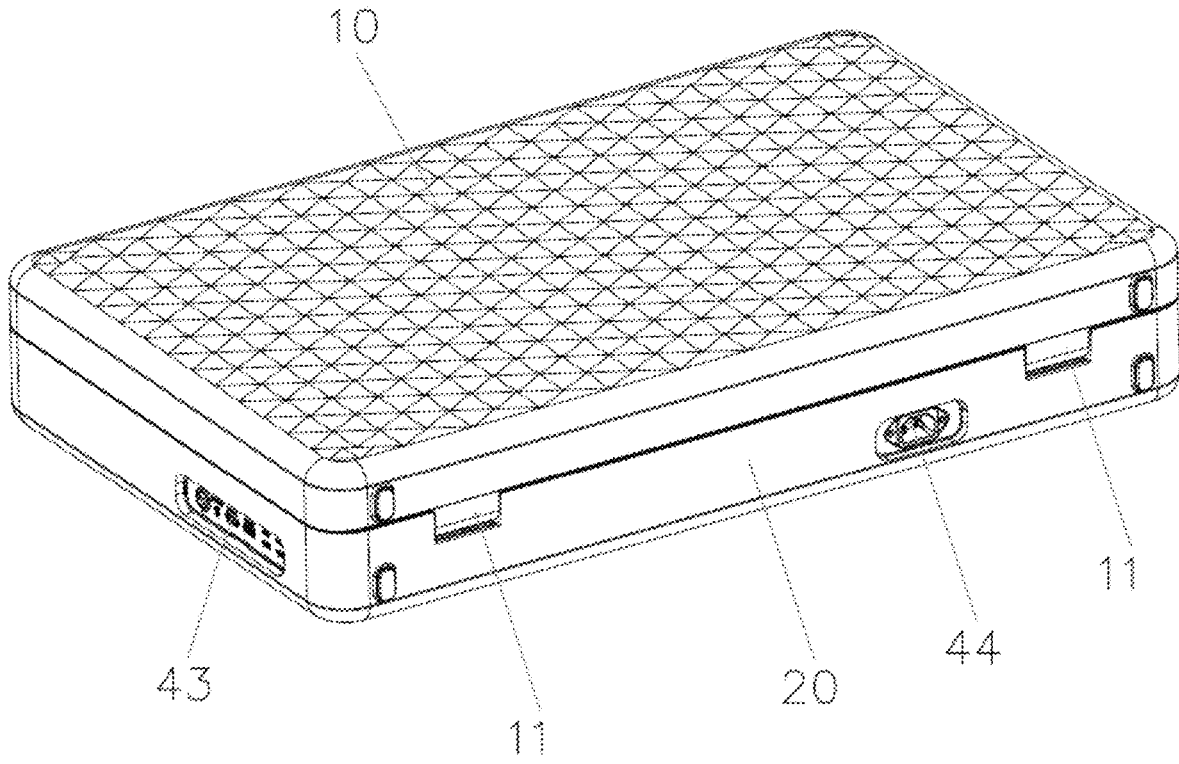
FIG. 2 is another schematic structural view of the briefcase design smart screen of the present application.
Figure 3:
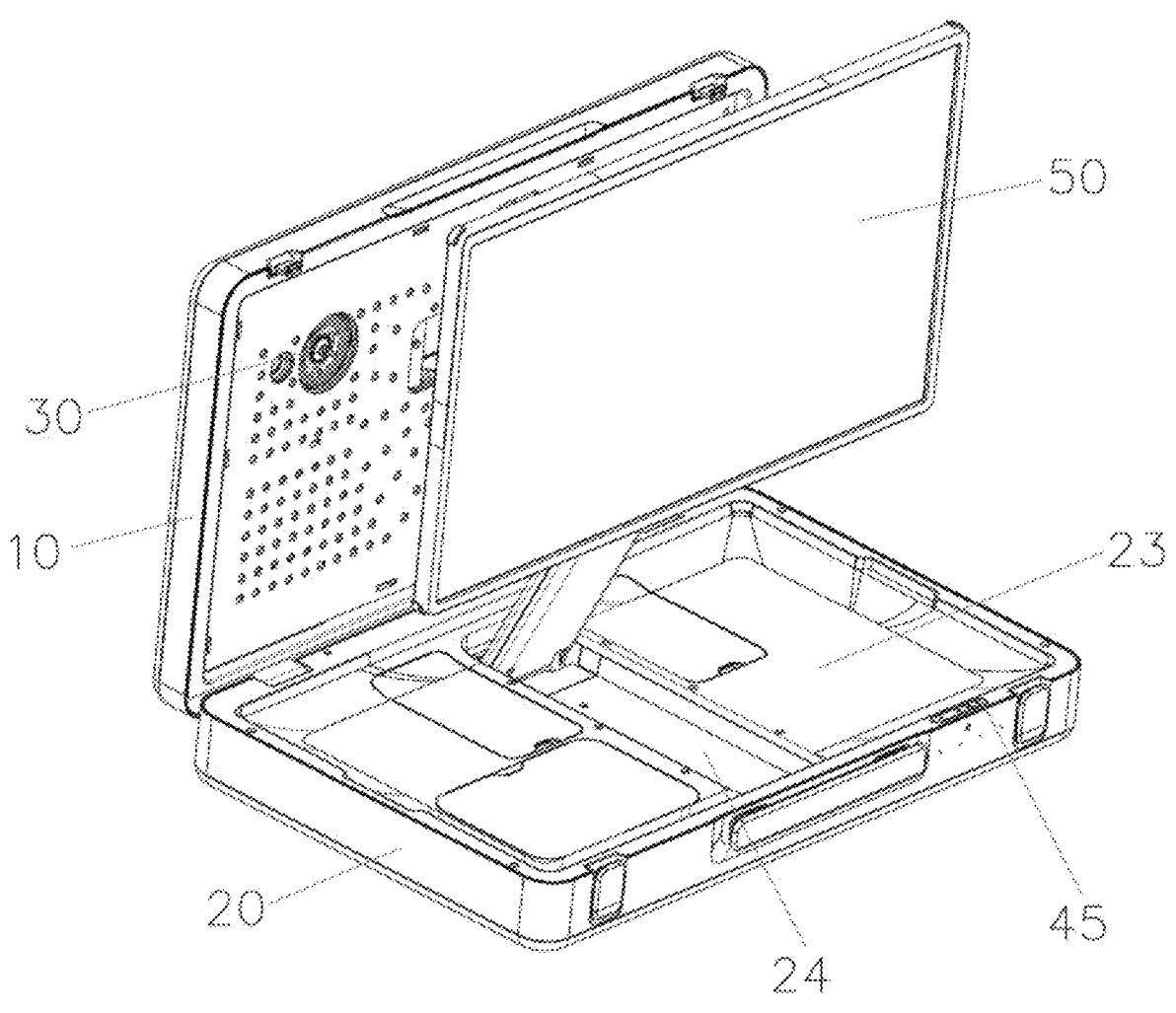
FIG. 3 is a reference diagram of a use state of the briefcase design smart screen of the present application where an upper housing thereof is opened.
Figure 4:
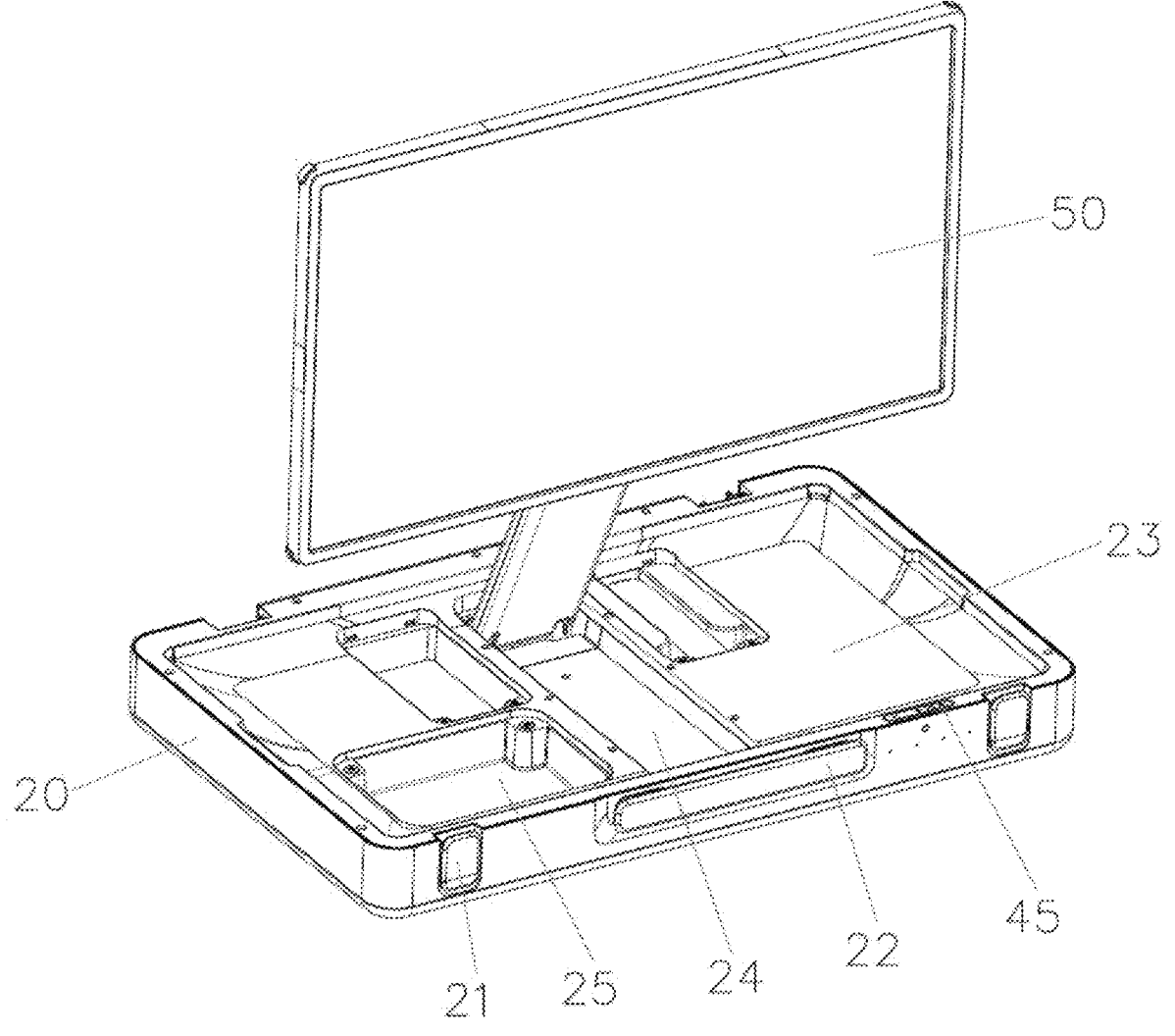
FIG. 4 is a schematic structural view of an lower housing of the briefcase design smart screen of the present application.
Figure 5:
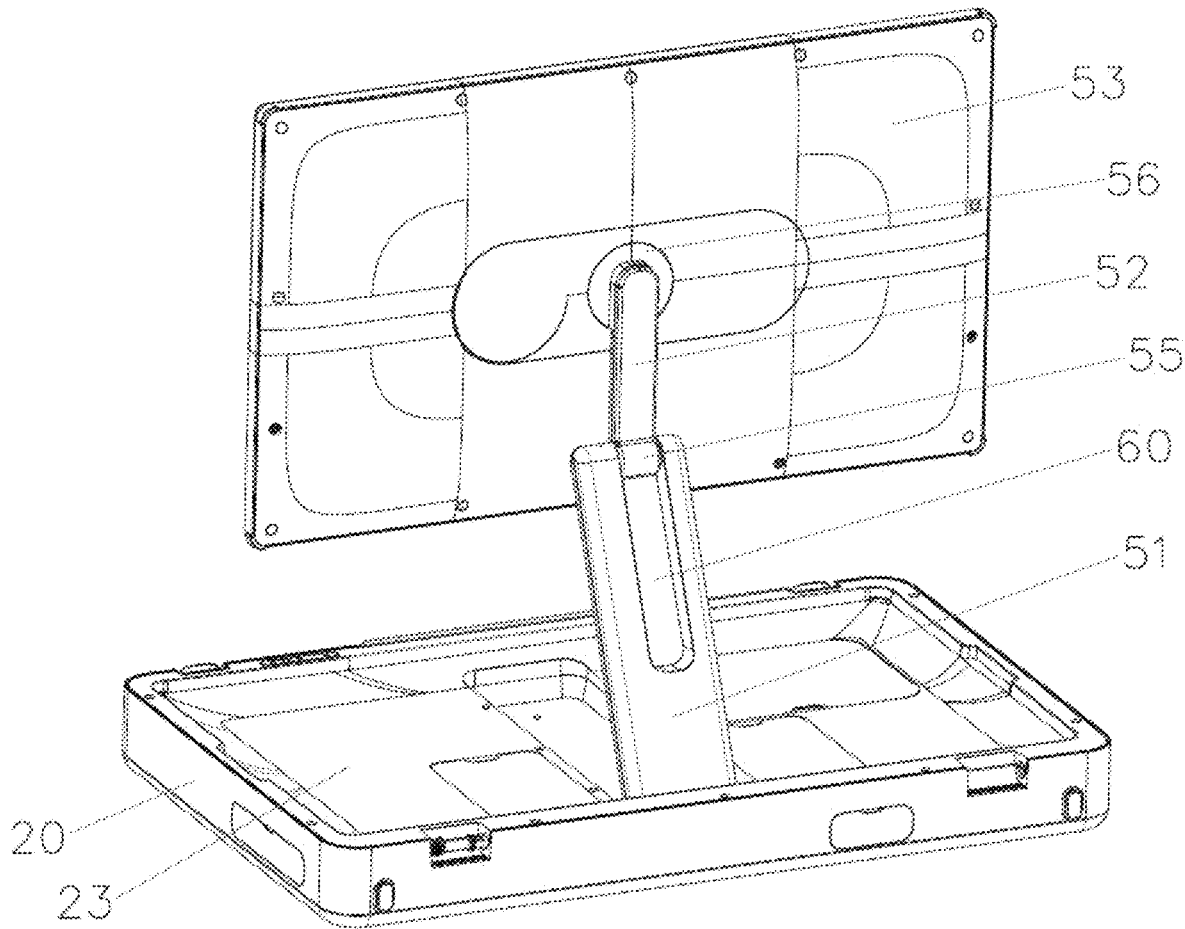
FIG. 5 is another schematic structural view of the lower housing of the briefcase design smart screen of the present application.
Figure 6:
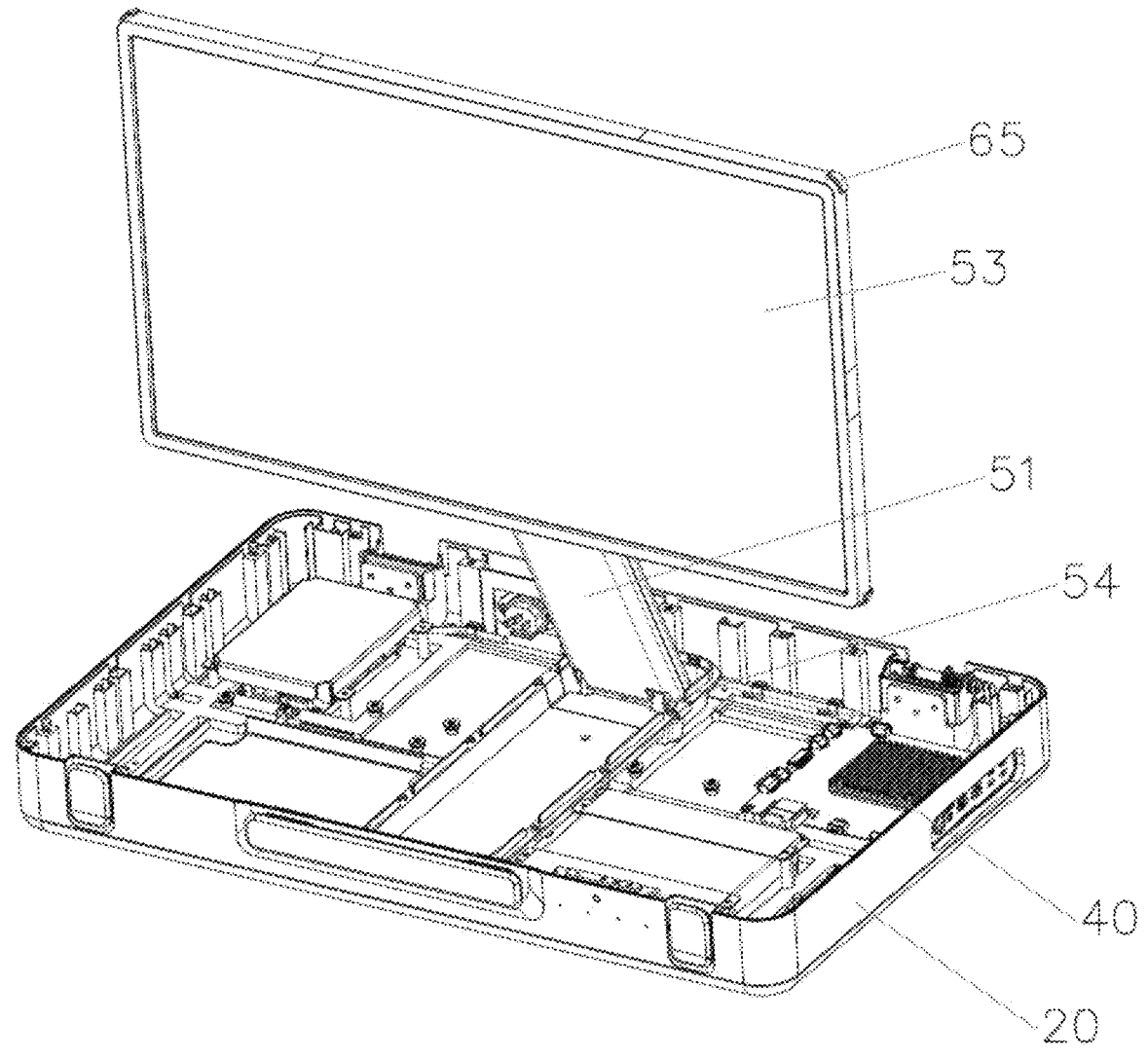
FIG. 6 is a schematic internal structural view of the lower housing of the briefcase design smart screen of the present application.
Figure 7:
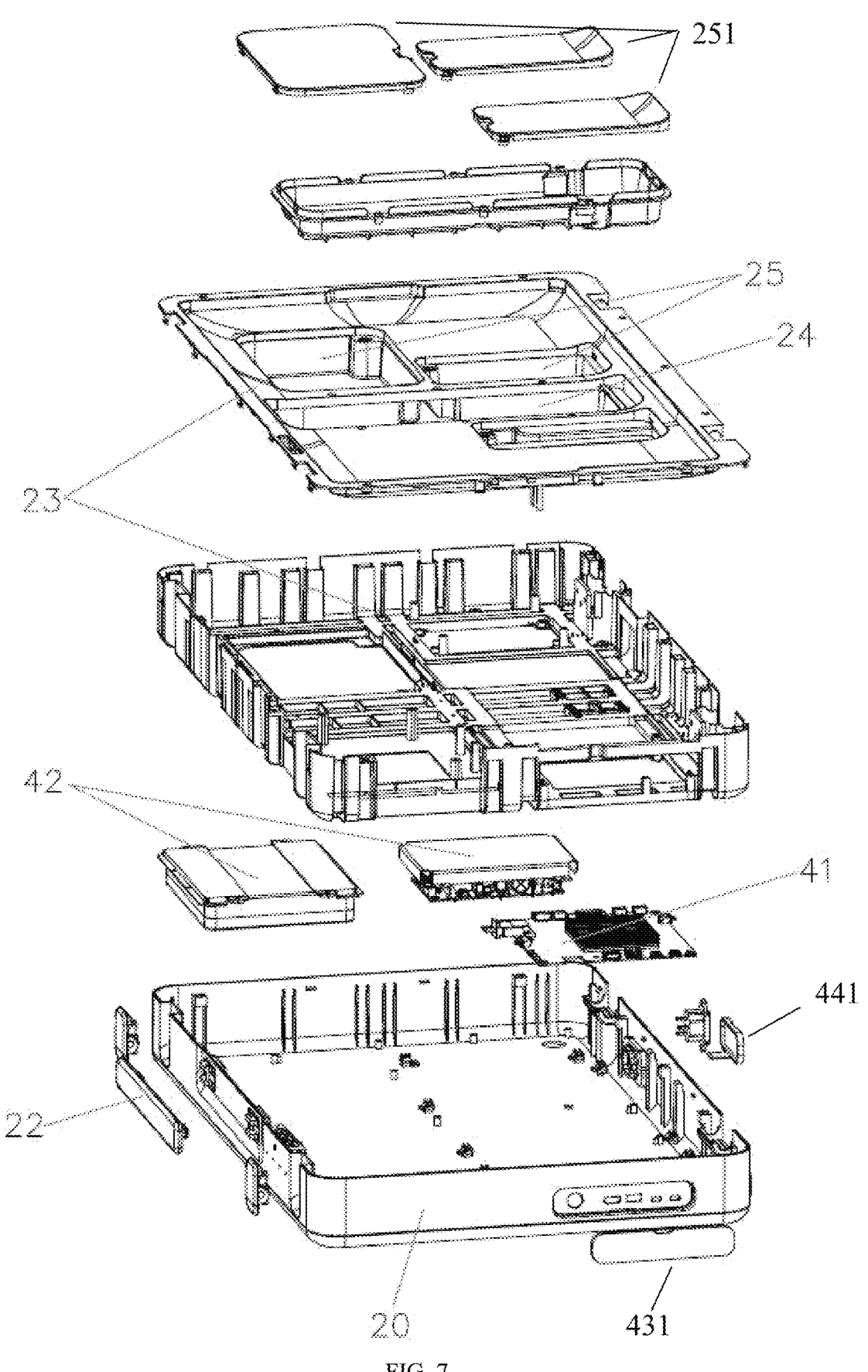
FIG. 7 is an exploded schematic view of the lower housing of the briefcase design smart screen of the present application.
Figure 8:
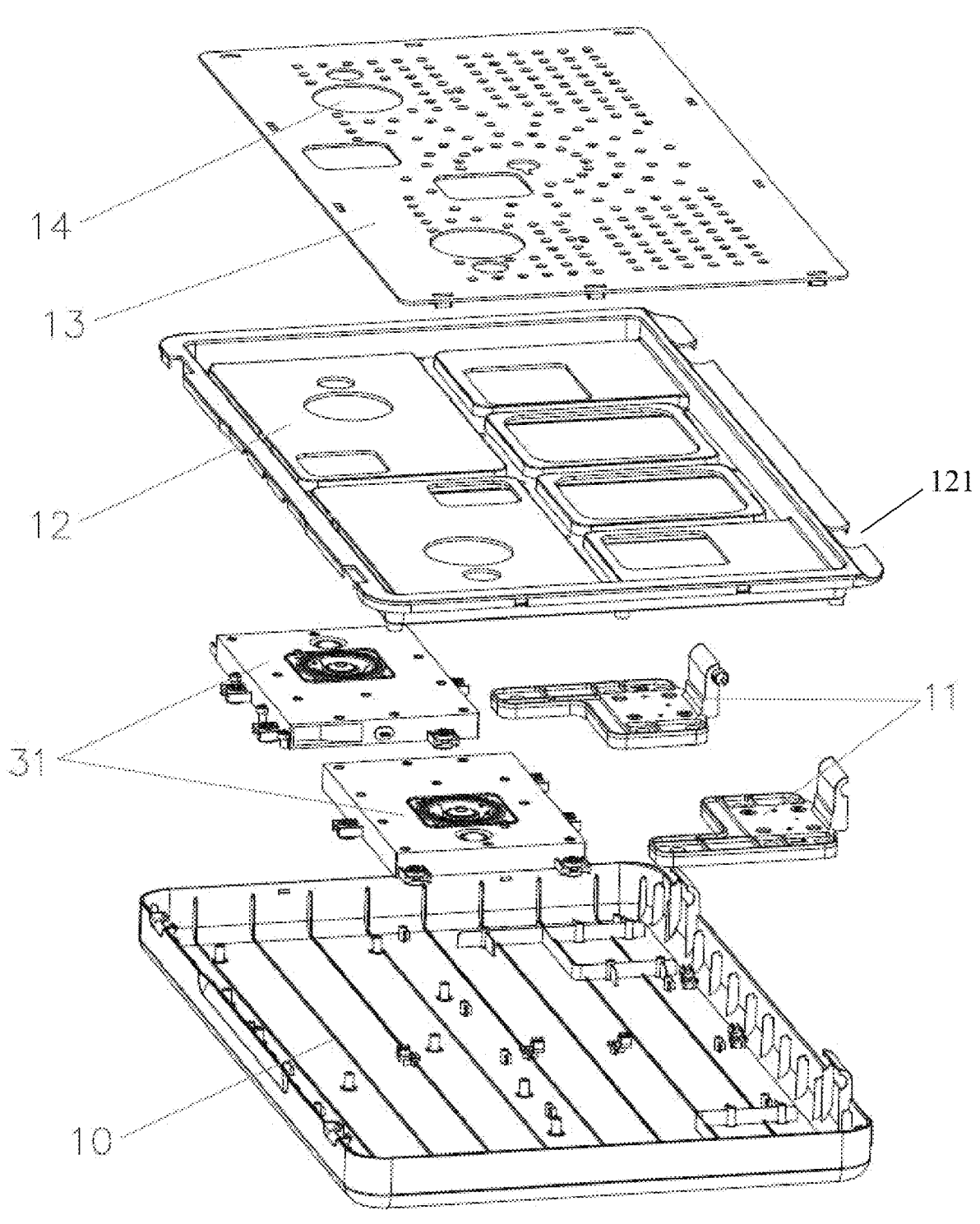
FIG. 8 is an exploded schematic view of the upper housing of the briefcase design smart screen of the present application.
Figure 9:
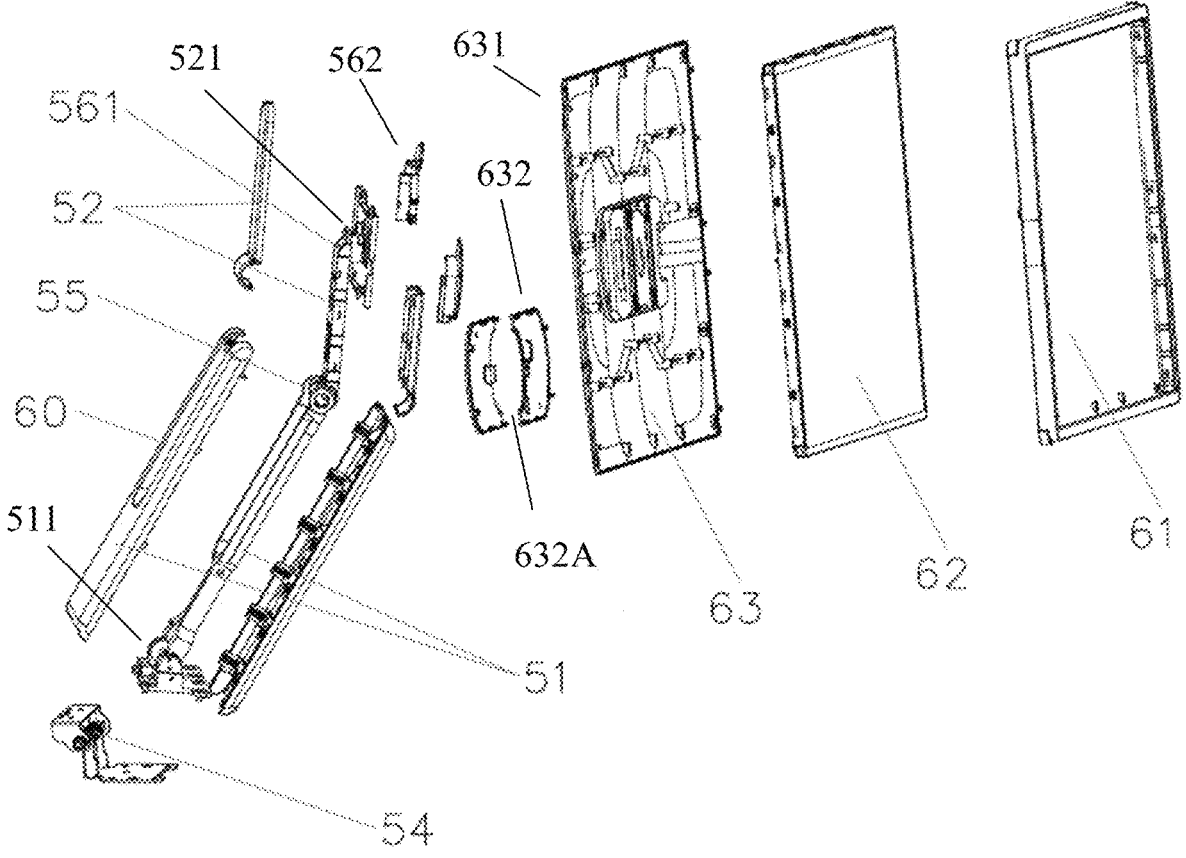
FIG. 9 is an exploded schematic view of a display assembly of the briefcase design smart screen of the present application.
Figure 10:
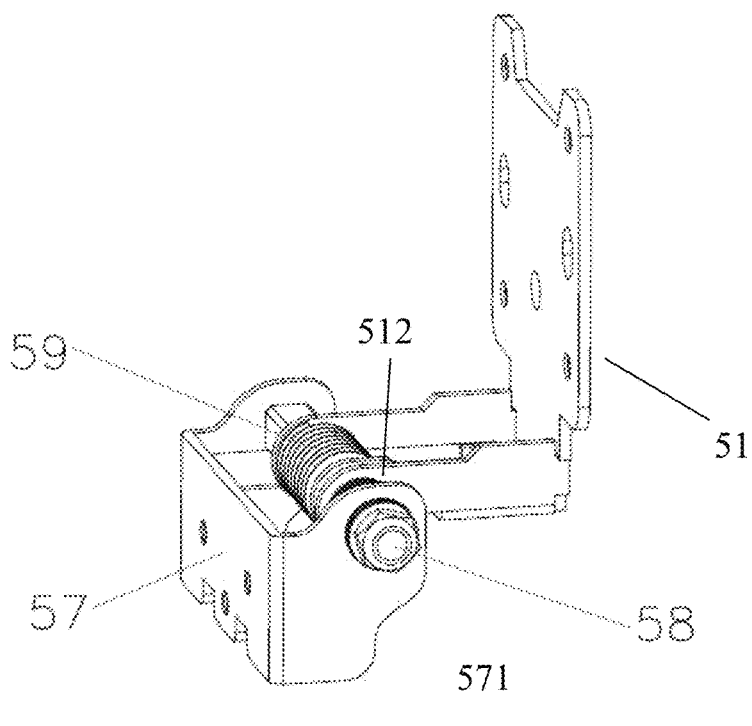
FIG. 10 is a schematic structural view of a support damping rotating shaft of the briefcase design smart screen of the present application.
Figure 11:
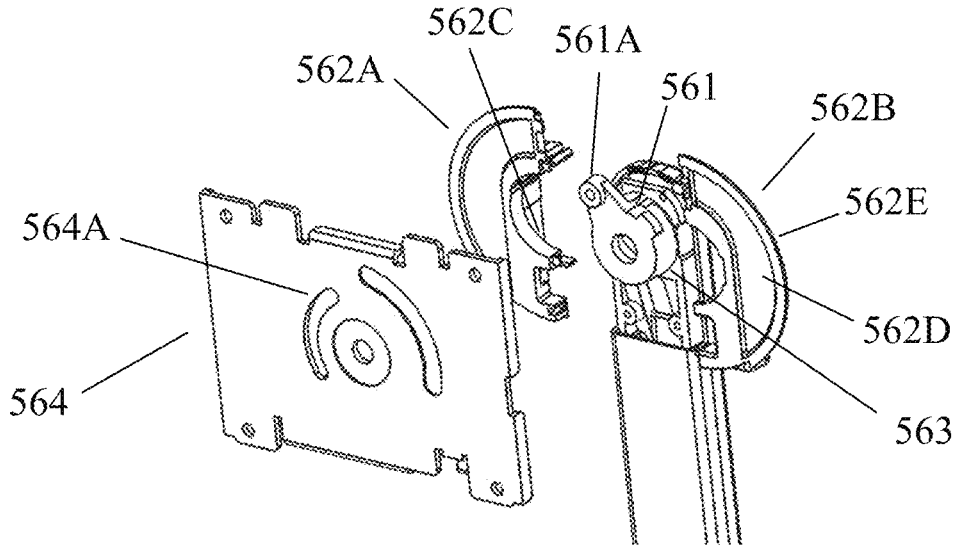
FIG. 11 is a partially exploded view of the rotating base of the briefcase design smart screen of the present application.
Figure 12:
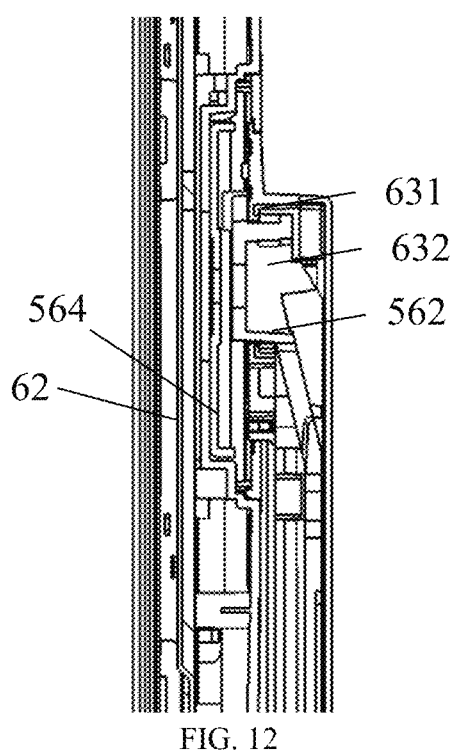
FIG. 12 is a partial cross-sectional side view of the briefcase design smart screen of the present application.
Figure 13:
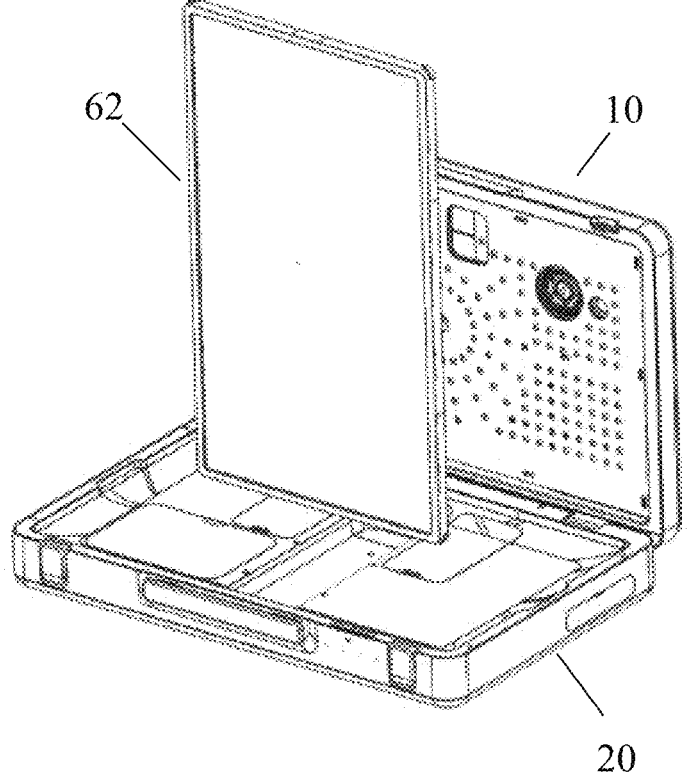
FIG. 13 is another schematic structural view of the briefcase design smart screen of the present application where the display main body is in a rotating state.

Please refer to FIG. 1 to FIG. 13. This embodiment provides a briefcase design smart screen including an upper housing 10 and a lower housing 20, in which a rear part of the upper housing 10 is hingedly connected to a rear part of the lower housing 20, and a front part of the upper housing 10 is locked with a front part of the lower housing 20; a speaker assembly 30 is provided in the upper housing 10, a control assembly 40 and a display assembly 50 are provided in the lower housing 20, and the control assembly 40 is electrically connected to the speaker assembly 30; and the display assembly 50 includes a support frame 51, a connecting arm 52, and a display screen 53, wherein one end of the support frame 51 is rotatably arranged in the lower housing 20, the other end of the support frame 51 is hingedly connected to one end of the connecting arm 52, the display screen 53 is rotatably disposed at the other end of the connecting arm 52, and the display screen 53 is electrically connected to the control assembly 40.

Therefore, the briefcase design smart screen of the present application is able to freely be carried through the design of the upper housing 10 and the lower housing 20 that is able to be closed together. Furthermore, the speaker assembly 30 is provided in the upper housing 10, the control assembly 40 and the display assembly 50 are provided in the lower housing 20, which ensures the briefcase design smart screen of the present application has functions such as loudspeaking function, display function, etc., while it does not occupy too much volume and its layout is compact and reasonable, and the display screen 53 is easy to use and store, and a user is able to freely and flexibly adjust a height or angle of the display screen 53.

In this embodiment, the rear part of the upper housing 10 and the rear part of the lower housing 20 are able to be hinged together through two hinge members 11, the front part of the upper housing 10 and the front part of the lower housing 20 are able to be locked together through two latches 21, so as to facilitate a user to open or lock the upper housing 10. In addition, in order to facilitate the user to carry, the lower housing 20 in this embodiment is provided with a handle 22 in the middle of the front part, and the handle 22 of this embodiment has a U-shaped structure.

Optionally, a bottom box 23 is provided inside the lower housing 20, an upper surface of the bottom box 23 is a concave surface which matches a shape of the display screen 53, so that the display screen 53 is able to be received on the concave surface of the bottom box 23; the concave surface of the bottom box 23 is recessed downward to form a receiving groove 24, and a shape of the receiving groove 24 is adapted to a shape of the support frame 51, so that the support frame 51 is able to be received in the receiving groove 24. Therefore, in this embodiment, the concave surface of the bottom box 23 is designed to match the shape of the display screen 53, so that when the display screen 53 is not in use, the display assembly 50 is able to be stored in the concave surface of the bottom box 23, making an upper surface of the display assembly 50 is flush with or slightly lower than an upper surface of the lower housing 20, which will not hinder closing between the upper housing 10 and the lower housing 20.

In this embodiment, a recessed height of the bottom box 23 is slightly larger than a thickness of the display screen 53, and a volume of the receiving groove 24 is slightly larger than a volume of the support frame 51, so that the storing of the support frame 51 and the display screen 53 is smoother and will not cause any obtrusiveness.

Optionally, a top box 12 is provided in the upper housing 10, the speaker assembly 30 includes a speaker unit 31 which is disposed inside the top box 12, the top box 12 is provided with a sound transmission opening 14 corresponding to a loudspeaking end of the speaker unit 31, and the speaker unit 31 is electrically connected to the control assembly 40.

In this embodiment, a number of the speaker units 31 is two, and they are respectively arranged in the top box 12, one on the left and the other on the right. In addition, a top cover 13 is detachably provided on the top box 12, and the sound-transmitting openings 14 are provided on the top cover 13, so that sounds from the two speaker units 31 are able to be transmitted through. In addition, the speaker unit 31 of this embodiment is electrically connected to the control assembly 40 through wires. In an embodiment, wire passing holes 121 are provided on the top box 12 to facilitate the wires of the speaker unit 31 to pass through.

Optionally, the bottom box 23 is provided with a plurality of receiving portions 25 with top openings, and the opening of each receiving portion 25 is detachably covered with a cover plate 251; the control assembly 40 includes a control mainboard 41 and a power supply 42, in which the control mainboard 41 is electrically connected to the power supply 42, and the control mainboard 41 and the power supply 42 are respectively arranged inside the bottom box 23. Therefore, this embodiment provides a plurality of receiving portions 25 on the bottom box 23 to facilitate the user to store other accessories and increase a storage space of the briefcase design smart screen according to this embodiment.

In this embodiment, the power supply 42 is arranged near the rear part of the lower housing 20, and the power supply 42 in this embodiment is a storage battery structure, and its charging port 44 is arranged at the rear part of the lower housing 20 to facilitate the user to access the power supply 42 for charging; secondly, the charging port 44 of this embodiment is covered with a charging cover 441, so that when not charging, the charging port 44 is covered by the charging cover to prevent dust from entering. In addition, the control mainboard 41 of this embodiment is arranged near a side of the lower housing 20, and several pluggable interfaces 43 of the control mainboard 41 are respectively located on a side wall of the lower housing 20 to facilitate the user to connect external devices; Similarly, several pluggable interfaces 43 are covered with a pluggable interface cover 431, so that the pluggable interfaces 43 are able to be protected and dust-proof when they are not in use.

In addition, the control assembly 40 of this embodiment also includes a control switch 45, which is electrically connected to the control mainboard 41, and the control switch 45 of this embodiment is disposed at an edge of an upper surface of the lower housing 20 to facilitate the user's operation.

Optionally, one end of the receiving groove 24 is provided with a support damping rotating shaft 54, and one end of the support frame 51 is hingedly connected to the support damping rotating shaft 54; the other end of the support frame 51 is provided with a connecting damping rotating shaft 55, and one end of the connecting arm 52 is hingedly connected to the connecting damping rotating shaft 55; and the other end of the connecting arm 52 is provided with a rotating base 56, and the display screen 53 is rotatably arranged on the rotating base 56. An axis of the support damping rotating shaft 54, an axis of the connecting damping rotating shaft 55 and a rotating axis of the display screen 53 and the rotating base 56 are parallel to each other. Therefore, in this embodiment, by arranging the support damping rotating shaft 54 in the receiving groove 24, the support frame 51 is able to be rotatably arranged, and a damping force of the support damping rotating shaft 54 is used to facilitate the user to rotate the support frame 51 at a certain angle and make it firmly stop. Furthermore, in this embodiment, by arranging the connecting damping rotating shaft 55 between the connecting arm 52 and the support frame 51, a damping force of the connecting damping rotating shaft 55 is able to be used to facilitate the user to rotate the connecting arm 52 at a certain angle and make it firmly stop; that is to say, in this embodiment, a height of the display screen 53 is flexibly adjusted through the support frame 51 and the connecting arm 52, and a rotation angle of the display screen 53 is flexibly adjusted through the rotating base 56.

Furthermore, the support damping rotating shaft 54 includes a support base 57, a support screw shaft 58, and a damping spring 59, in which the support base 57 is arranged in the receiving groove 24, and the support base 57 is provided with two coaxial support shaft holes 571 at intervals, the support screw shaft 58 passing through the two coaxial support shaft holes 571; one end of the support frame 51 is provided with two coaxial rotation shaft holes 512 at intervals, and the support frame 51 is installed on the support screw shaft 58 through the two rotation shaft holes 512, and the damping spring 59 is sleeved on the support screw shaft 58, and two ends of the damping spring 59 respectively abut against inner surfaces of the support frame 51. Therefore, in this embodiment, the damping spring 59 is used to provide a damping force, so that the support frame 51 is able to be stopped and fixed after rotation, which is convenient for the user to perform operations at a current angle.

In addition, in this embodiment, one end of the support frame 51 is recessed with an escape groove 60 along its length direction, and the connecting damping rotating shaft 55 is provided at one end of the escape groove 60 close to an open end of the support frame 51; a length of the escape groove 60 is greater than a length of the connecting arm 52, and a width of the escape groove 60 is greater than a width of the connecting arm 52, so that the connecting arm 52 is able to be received in the escape groove 60. Therefore, in this embodiment, by arranging the escape groove 60 on the support frame 51, it is convenient for the connecting arm 52 to be integrated with the support frame 51 and be received in the receiving groove 24 of the bottom box 23 at the same time, so that a height adjustment range of the display screen 53 is increased without taking up additional storage space.

Optionally, a structure of the connecting damping rotating shaft 55 in this embodiment is substantially the same as a structure of the support damping rotating shaft 54, or is other types of damping rotating shaft structures, which will not be described again here.

In this embodiment, the display screen 53 includes a display middle frame 61, a display main body 62, and a screen adapter board 63, the display main body 62 being arranged in the display middle frame 61, and the screen adapter board 63 being arranged on a back side of the display middle frame 61, which is away from the screen of the display main body 62; the rotating base 56 is located on a side of the screen adapter board 63 facing away from the display main body 62, and includes a rotating pillar 561, a rotating sleeve 562, and a friction sleeve 563, one end of the rotating pillar 561 is fixedly connected to a side surface of the connecting arm 52 facing the screen adapter board 63, and extends toward the screen adapter board 63 along a direction perpendicular to an axial direction of the connecting damping rotating shaft 55. In an embodiment, an axis of the rotating pillar 561 is perpendicular to the side surface of the connecting arm 52 facing the screen adapter board 63. The rotating sleeve 562 is sleeved on the rotating pillar 561 and is able to rotate relative thereto. In an embodiment, the rotating sleeve 562 includes a first rotating sleeve 562A and a second rotating sleeve 562B. The first rotating sleeve 562A and the second rotating sleeve 562B are butted with each other, a through hole 562C is formed therebetween, and the rotating pillar 561 is located in the through hole 562C. The friction sleeve 563 is made of a damping material such as rubber and the like, and surrounds an inner wall of the through hole 562C to be disposed between the rotating sleeve 562 and the rotating pillar 561, so that a damping force is generated between the rotating sleeve 562 and the rotating pillar 561. The rotating sleeve 562 is provided with a plate portion 562D and a flange portion 562E. A plate surface of the plate portion 562D is perpendicular to an axial direction of the through hole 562C. The flange portion 562E surrounds an outer edge of the plate portion 562D and forms a step with the plate surface of the plate portion 562D, and the flange portion 562E protrudes toward the screen adapter board 63 relative to the plate surface of the plate portion 562D. The screen adapter board 63 is fixedly connected to the rotating sleeve 562 and rotated accordingly with the rotating sleeve 562. In an embodiment, the screen adapter board 63 is provided with a main body 631 and a movable plate 632. The main body 631 is covered on the display middle frame 61. The movable plate 632 is movably embedded in the main body 631 and is provided with an opening 632A which is sleeved outside the plate portion 562D, so that the movable plate 632 is able to abut against the flange portion 562E to achieve installation of the screen adapter board 63 on the rotating sleeve 562. In an embodiment, the opening 632A and the plate portion 562E have an interference fit. Therefore, in this embodiment, the friction sleeve 563 is used to provide a damping force for the rotating sleeve 562, so that the support frame 53 is able to be stopped and fixed after rotation, which is convenient for the user to perform operations at a current angle. In addition, in this embodiment, protective pads 65 are respectively provided on outsides of four corners of the display middle frame 61, and the protective pads 65 are able to protect the display middle frame 61.

Wherein, the rotating base 56 also includes a rotating front plate 564, which is fixed on a side surface of the screen adapter board 63 facing the display body 62, and the plate surface is perpendicular to an axial direction of the rotating pillar 561. An arc-shaped stopping groove 564A is formed on the rotating front plate 564, and the stopping groove 564A extends around an axis of the rotating pillar 561. In an embodiment, the rotating front plate 564 is arranged opposite to the movable plate 632 and separated by a certain distance. A stopping portion 561A is provided on the rotating pillar 561, the stopping portion 561A protrudes toward the rotating front plate 564, and the stopping portion 561A is slidably inserted into the stopping groove 564A. Therefore, in this embodiment, the stopping portion 561A is provided on the rotating pillar 561 to ensure that a rotation plane of the rotating front plate 564 does not change, thereby making the rotation of the display screen 53 stable and smooth, and is not prone to shaking.

In addition, the support frame 51 has an internal hollow cavity structure, and first wire passing holes 511 are provided at both ends of the support frame 51; the connecting arm 52 has an internal hollow cavity structure, and second wire passing holes 521 are provided at both ends of the connecting arm 52; and the display screen 53 is electrically connected to the control assembly 40 by wires passing through the second wire passing holes 521 and the first wire passing holes 511 in sequence. Therefore, in this embodiment, by arranging a wire passing structure on the support frame 51 and the connecting arm 52, wiring layout of the display screen 53 is facilitated, and the wire passing structure is able to be stored and hidden therein to prevent disorder of wiring of the display screen 53.

The briefcase design smart screen of this embodiment is in a shape of a box when not in use, and the user is able to easily carry and move it through the handle 22. When in use, firstly the latch 21 is unlocked so that the upper housing 10 opens upward, then the display screen 53 is lifted up, a display height or angle of the display screen 53 is adjusted by adjusting a height of the support frame 51 and the connecting arm 52, and a display angle of the display screen 53 is adjusted by rotating the display screen 53; therefore, the display screen 53 is able to be adjusted flexibly and freely to facilitate the user's use. After use, firstly, the connecting arm 52 is received into the escape groove 60 of the support frame 51, then the support frame 51 is received into the receiving groove 24 of the bottom box 23, and then the display screen 53 is rotated to a position corresponding to the concave surface of the bottom box 23 and the display screen 53 is stored on the concave surface of the bottom box 23. Then the upper housing 10 is closed to complete the storage, and is able to be carried away after being re-locked by the latch 21.

Therefore, the briefcase design smart screen of the present application is able to be freely carried through the design of the upper housing 10 and the lower housing 20 that are able to be closed together. Furthermore, the speaker assembly 30 is provided in the upper housing 10, the control assembly 40 and the display assembly 50 are provided in the lower housing 20, which ensures the briefcase design smart screen of the present application has functions such as loudspeaking function, display function, etc., while it does not occupy too much volume and its layout is compact and reasonable, and the display screen 53 is easy to use and store, and the user may freely and flexibly adjust a height or angle of the display screen 53.

The embodiments described above merely illustrate several implementations of the present application and are described relatively specifically and in detail, but should not be construed as limiting the briefcase design smart screen of the present application. It should be noted that for a person skilled in the art, several modifications and improvements can be made without departing from the concept of the present application, and these all fall within the protection scope of the present application.

What is claimed:

1. A briefcase design smart screen, wherein
comprising an upper housing and a lower housing, a rear part of the upper housing is hingedly connected to a rear part of the lower housing, and a front part of the upper housing is locked with a front part of the lower housing;
a speaker assembly is provided in the upper housing, a control assembly and a display assembly are provided in the lower housing, and the control assembly is electrically connected to the speaker assembly; and
the display assembly includes a support frame, a connecting arm, and a display screen, wherein one end of the support frame is rotatably arranged in the lower housing, another end of the support frame is hingedly connected to one end of the connecting arm, the display screen is rotatably disposed at another end of the connecting arm, and the display screen is electrically connected to the control assembly;
a bottom box is provided inside the lower housing, an upper surface of the bottom box is a concave surface which matches a shape of the display screen, so that the display screen is received on the concave surface of the bottom box; the concave surface of the bottom box is recessed downward to form a receiving groove, and a shape of the receiving groove is adapted to a shape of the support frame, so that the support frame is able to be received in the receiving groove;
the bottom box is provided with a plurality of receiving portions with top openings to store other accessories, and the opening of each receiving portion is detachably covered with a cover plate; the control assembly includes a control mainboard and a power supply, wherein the control mainboard is electrically connected to the power supply, and the control mainboard and the power supply are respectively arranged inside the bottom box.

2. The briefcase design smart screen of claim 1, wherein, one end of the receiving groove is provided with a support damping rotating shaft, and one end of the support frame is hingedly connected to the support damping rotating shaft; the other end of the support frame is provided with a connecting damping rotating shaft, and one end of the connecting arm is hingedly connected to the connecting damping rotating shaft; and the other end of the connecting arm is provided with a rotating base, the display screen is rotatably arranged on the rotating base.

3. The briefcase design smart screen of claim 2, wherein, the support damping rotating shaft includes a support base, a support screw shaft, and a damping spring, wherein the support base is arranged in the receiving groove, and the support base is provided with two coaxial support shaft holes at intervals, the support screw shaft passing through the two support shaft holes; one end of the support frame is provided with two coaxial rotation shaft holes at intervals, the support frame is installed on the support screw shaft through the two rotation shaft holes, the damping spring is sleeved on the support screw shaft, and two ends of the damping spring respectively abut against inner surfaces of the support frame.

4. The briefcase design smart screen of claim 2, wherein, the display screen includes a display middle frame, a display main body, and a screen adapter board, the display main body being arranged in the display middle frame, and the screen adapter board being arranged on a back side of the display middle frame; the rotating base includes a rotating pillar, a rotating sleeve, and a friction sleeve, one end of the rotating pillar is fixedly connected to the connecting arm and extends toward the screen adapter board in an axial direction perpendicular to the connecting damping rotating shaft, the rotating sleeve is rotatably arranged on the rotating pillar, and the friction sleeve is arranged between the rotating sleeve and the rotating pillar, causing a damping force to be generated between the rotating sleeve and the rotating pillar; and the screen adapter board is fixedly connected to the rotating sleeve.

5. The briefcase design smart screen of claim 4, wherein, a stopping portion is provided on the rotating pillar, the rotating base further includes a rotating front plate connected to the screen adapter board and facing to the screen adapter board with a plate surface, and an arc-shaped stopping groove is provided on the rotating front plate, the stopping portion being slidably inserted into the stopping groove.

6. The briefcase design smart screen of claim 2, wherein, the support frame has an internal hollow cavity structure, and first wire passing holes are provided at both ends of the support frame; the connecting arm has an internal hollow cavity structure, and second wire passing holes are provided at both ends of the connecting arm; and the display screen is electrically connected to the control assembly by wires passing through the second wire passing holes and the first wire passing holes in sequence.

7. The briefcase design smart screen of claim 2, wherein, one end of the support frame is recessed with an escape groove along its length direction, and the connecting damping rotating shaft is provided at one end of the escape groove close to an open end of the support frame; a length of the escape groove is greater than a length of the connecting arm, and a width of the escape groove is greater than a width of the connecting arm, so that the connecting arm is received in the escape groove.

8. The briefcase design smart screen of claim 1, wherein, a top box is provided in the upper housing, the speaker assembly includes a speaker unit which is disposed inside the top box, the top box is provided with a sound transmission opening corresponding to a loudspeaking end of the speaker unit, and the speaker unit is electrically connected to the control assembly.

* * * * *